United States Patent [19]

Man

[11] Patent Number: 5,376,233

[45] Date of Patent: Dec. 27, 1994

[54] METHOD FOR SELECTIVELY ETCHING OXIDES

[75] Inventor: Yong Man, Dallas, Tex.

[73] Assignee: Texas Instruments Incorporated, Dallas, Tex.

[21] Appl. No.: 999,590

[22] Filed: Dec. 30, 1992

Related U.S. Application Data

[63] Continuation of Ser. No. 833,214, Feb. 10, 1992.

[51] Int. Cl.$^5$ .................................... H01L 21/00
[52] U.S. Cl. ........................ 156/662; 156/646; 156/657; 156/653
[58] Field of Search ............... 156/646, 662, 653, 655, 156/657

[56] References Cited

U.S. PATENT DOCUMENTS 4,605,479  8/1986  Faith .................................. 156/646
5,173,152  12/1992  Tanaka .............................. 156/662

FOREIGN PATENT DOCUMENTS 0421315  4/1991  European Pat. Off. .
55-125632  9/1980  Japan .
61-268064  11/1986  Japan .

OTHER PUBLICATIONS

"VLSI Fabrication Principles: Silicon and Gallium Arsenide", Ghandi; ©1983; John Wiley & Sons, Inc.; pp. 353-355, 424-427.
"Gas-Phase Selective Etching of Native Oxide"; Miki et al.; IEEE Transactions on Electron Services; 37(1990) Jan. 1, No. 1.
"the Dry Ox Process for Etching Silicon Dioxide", Bersin et al.; Solid State Techn.; 20(4); 78-80.
"8th Symposium on ULSI Ultraclean Technology-Submicron ULSI Process Tech."; Japan, pp. 200-201.
"Submicron ULSI Process Technology: Proceedings of Symposium on ULSI Ultraclean Techn", Japan, pp. 172-181.
"Etching of thin SiO2 layers using wet HFgas", P. A. M. Van Der Heide et al., Journal of Vacuum Science and Tech.: Part A, May 1989, pp. 1719-1723.
"Etch Rate Reduction Via Rapid Thermal Annealing"; Research Disclosure; Anon.; 283,738; 1987; Abstract.

Primary Examiner—R. Bruce Breneman
Assistant Examiner—George Goudreau
Attorney, Agent, or Firm—Jacqueline J. Garner; Richard Donaldson; William E. Hiller

[57] ABSTRACT

A method for selectively etching oxides from the face of a semiconductor layer 10 is disclosed herein. The semiconductor layer 10 has at least first and second oxide regions 12 and 14 formed on the surface thereof. The oxides 12 and 14 may be doped oxides such as BPSG or PSG and/or thermally treated oxides such as a thermally grown oxide or a deposited oxide which is subsequently annealed. Native and chemical oxides are also considered. The semiconductor wafer 10 is heated to a temperature greater than room temperature (e.g., about 25° C.) and a vapor phase hydrogen fluoride etch is performed so that one of the oxides 14 etches away at a rate significantly higher than the other oxide region 12. Other systems and methods are also disclosed.

20 Claims, 6 Drawing Sheets

METHOD FOR SELECTIVELY ETCHING OXIDES

This invention was made with government support under Contract No. F33615-88-C-5448 awarded by the United States Air Force. The Government may have certain rights in this invention.

This application is a continuation of application Ser. No. 07/833,214 filed Feb. 10, 1992 which is now abandoned.

FIELD OF THE INVENTION

This invention generally relates to the fabrication of semiconductor devices and specifically to a method for selectively etching oxides.

BACKGROUND OF THE INVENTION

During the fabrication of semiconductor integrated circuits, materials are formed on the wafer surface and portions of layers must be removed or etched. Materials which are etched include semiconductors, conductors (such as metal) and insulators such as nitrides and oxides. The present invention is concerned primarily with oxides.

Numerous different oxides may be utilized during device fabrication. These oxides may be thermally grown or deposited, for example by a TEOS (tetraethoxysilane) process. Silicate glass such as PSG (phosphosilicate glass) and BPSG (boron phosphosilicate glass) are also used. In addition, undesired oxide films, such as native or chemical oxides, may be formed due to the wafer's exposure to the environment. In many process flows, it is desirable to selectively etch one type of oxide but not another.

The selectivity of a process is a measure of the etch rate of the layer to be etched relative to other materials on the wafer surface. The selectivity of etches to different materials is an important process characteristic. Overetching is the common practice of submitting a layer to the etch process for a time longer than is necessary to just etch through the layer at one part of a wafer. It is because of this overetch that the selectivity to layers underlying the etched layer or to layers exposed simultaneously with the etched layer becomes critical.

Accordingly, there is a need in the industry for an etch process which selectively etches different types of oxides.

SUMMARY OF THE INVENTION

Other objects and advantages will be obvious, and will in part appear hereinafter and will be accomplished by the present invention which provides a method and apparatus for selectively etching oxides.

A method for selectively etching oxides from the face of a semiconductor wafer is disclosed herein. A semiconductor layer has at least first and second oxide regions formed on the surface thereof. The oxides may be doped oxides such as BPSG or PSG and/or thermally treated oxides such as a thermally grown oxide or a deposited oxide which is subsequently annealed. Native and chemical oxides are also considered. The semiconductor wafer is heated to a temperature greater than room temperature (e.g., about 25° C.) and a vapor phase hydrogen fluoride etch is performed so that one of the oxides etches away at a rate significantly higher than the other oxide region.

An advantage of the invention is that different types of oxides may be etched at different rates thereby allowing for more processing freedom. This range of selectivity control is not present in conventional, room-temperature solution or plasma chemistry based etch processes.

Another advantage is that the vapor phase process requires no rinsing or drying after the etch.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the method and system of the present invention. The preferred embodiment will be described first followed by a description of modifications. Some experimental results from using the invention will then be described.

In the past, room temperature HF/H$_2$O (hydrogen fluoride/water) vapor etch of the oxides of silicon has been extensively characterized. Although it has been reported that thermal oxide ceased to etch at temperatures slightly above the room temperature, limited data exist on the temperature sensitivity of the etch when the nature of the silicon oxide is changed. High etch selectivity between doped and thermal oxide has been achieved by using the moisture sensitivity and the incubation time dependence of the vapor phase etch.

The present invention provides a well controlled method to selectively etch certain oxides while not etching other oxides (as well as other materials on the surface of the wafer). In the preferred embodiment, the process utilizes the known vapor hydrogen fluoride (HF) etch chemistry. Unlike conventional processes, however, the present invention utilizes wafer temperature to control the etch rates. The inventor has discovered that different types of oxides will etch at different rates and with different temperature dependencies and has applied this new knowledge to better control oxide etch processes.

The present invention utilizes the known vapor hydrogen fluoride etch chemistry. In the preferred embodiment, the process pressure may range from about a few to a few hundred torr, for example between about 10 torr and 700 torr. Typically, the HF flow rate ranges from about 1 to 15 liters. The wafer temperatures can range from greater than room temperature (e.g., >25° C.) to about 250° C.

Figure 1A:
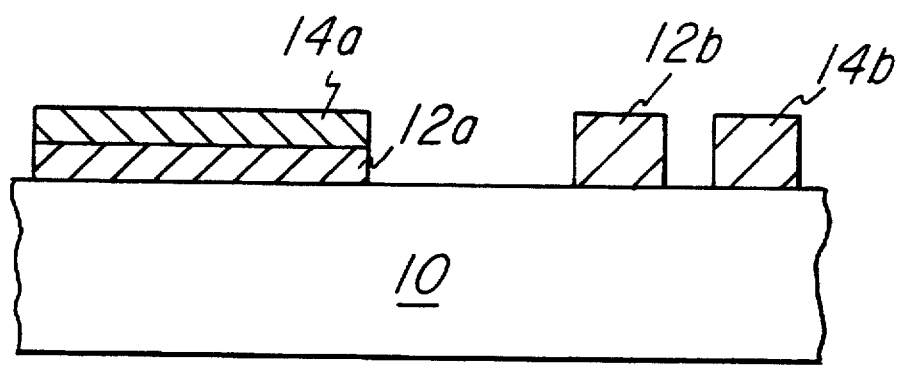
FIG. 1a and 1b are cross-sectional views of representative semiconductor workpieces.

FIG. 1 illustrates a greatly simplified semiconductor with several oxide regions formed on the surface thereof and is provided to illustrate representative features of the present invention. Referring first to FIG. 1a, a semiconductor layer 10 is provided. The semiconductor layer 10 may comprise a single crystalline substrate, an epitaxially grown semiconductor layer, a polycrystalline layer or an amorphous layer. The nature of the semiconductor layer is not critical to the present invention. In a preferred embodiment, the semiconductor wafer comprises silicon. It is anticipated that similar results will be found from other semiconductors such as germanium and gallium arsenide as two examples.

Several oxide regions have been illustrated on the surface of semiconductor layer 10. The figure has intentionally not been drawn to illustrate any specific device structure and is intended to represent any of the numerous oxide regions which are formed during integrated circuit fabrication.

Referring again to FIG. 1a, first oxide regions 12a and 12b are formed on the surface of semiconductor layer 10. A second oxide region 14a is formed over first oxide region 12a and a second oxide region 14b is formed adjacent to first oxide region 12b.

In a first example, first oxide regions 12 comprise a thermally treated oxide regions. In this example, thermally treated first oxide regions 12 may be thermally grown. For example, the region may be grown by the oxidation of a silicon surface in a steam ambient to create silicon dioxide. In addition, the first oxide region 12 may be deposited and subsequently subjected to an anneal process.

The second oxide region 14 may comprise a doped oxide region such as PSG (phosphosilicate glass) or BPSG (boron phosphosilicate glass). A more detailed discussion of possible oxides will be discussed below with reference to FIG. 2.

Figure 1B:
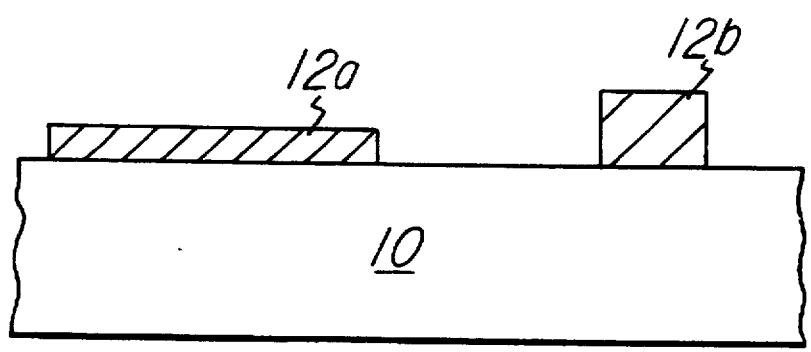

Referring now to FIG. 1b, the semiconductor wafer 10 is heated above room temperature (e.g., >25° C. or >30° C. or >35° C. or >40° C. or >45° C.). In a preferred embodiment, the temperature is elevated to between about 35° C. and 50° C., with a preferred value of about 45° C. if the etch selectivity between PSG and thermal oxide is to be optimized. The wafer 10, however, may be heated to temperatures as high as 250° C. or possibly higher.

The surface of the layer 10, including regions 12 and 14, is then subjected to the vapor phase hydrogen fluoride etch as described above. As illustrated in FIG. 1b, the second oxide region 14 will etch away at a rate significantly higher than the first oxide region 12. Specific examples will be discussed below with reference to FIGS. 2 through 6.

The invention described above has been tested experimentally. The methods of preparation of the various oxides used in this study are summarized in Table 1. Thermally grown oxides, plasma and non-plasma LPCVD oxides, doped and undoped oxides, and thin native and chemical oxides were investigated (although other oxides may also be considered). Prior to the vapor etch, the wafers (except for those with the native and chemical oxides) were heated to 150° C. in ozone for 60 seconds to prevent any uncontrolled effects caused by excessive moisture adsorption and trace organic deposits on the oxide surfaces. HF/water vapor was delivered into the etch chamber by passing a nitrogen carrier gas over a heated azeotropic solution of HF/water. During this experimentation, the chamber pressure was 40 torr during the etch and the wafers were heated with an infrared tungsten-halogen lamp.

Figure 2:
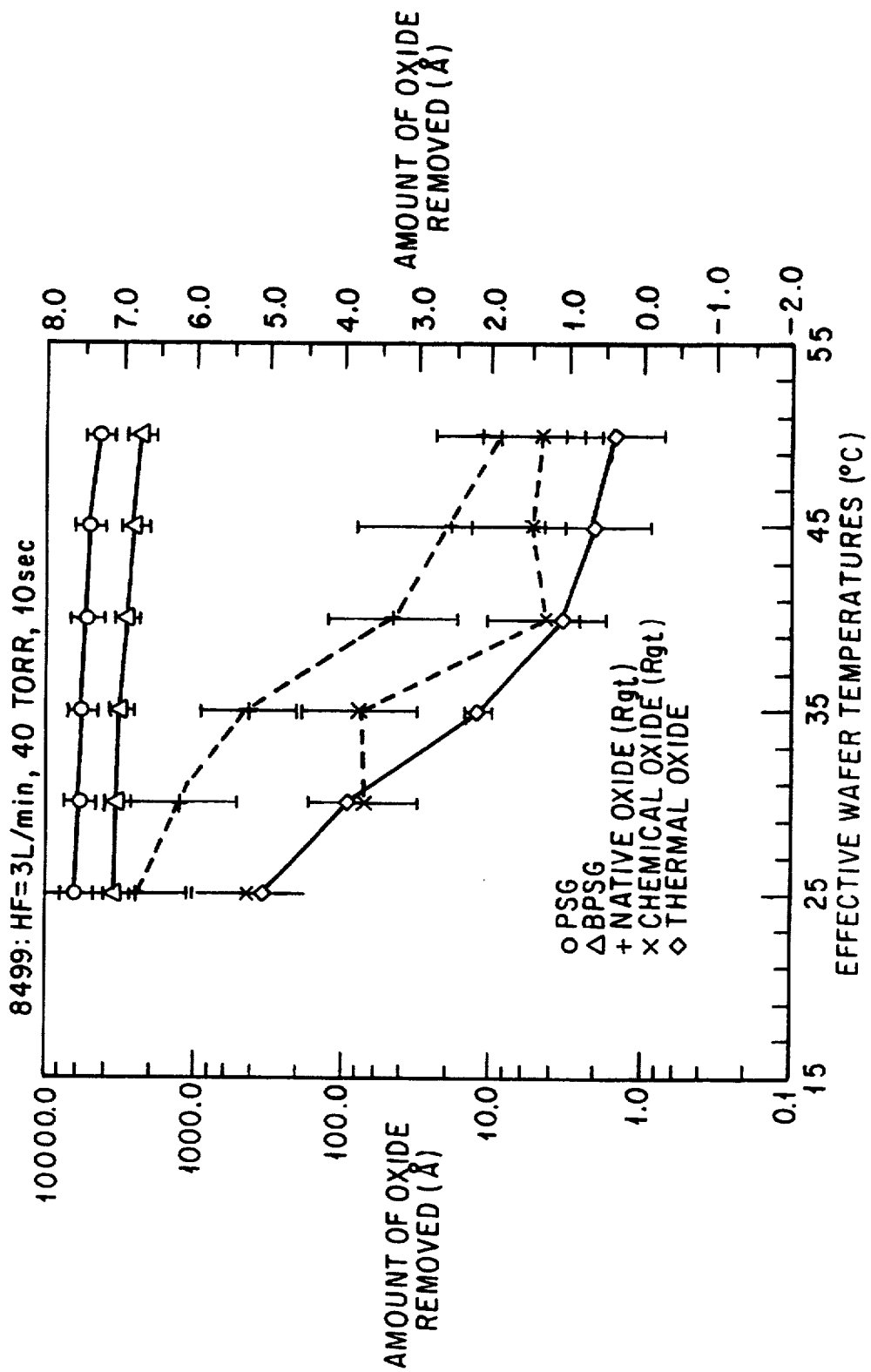
FIGS. 2 and 3 are graphical illustration of etch rates as a function of the wafer temperature.

The results of one particular experiment are graphically illustrated in FIG. 2 which illustrates wafer temperature dependence of the vapor HF etch of PSG, BPSG, thermal oxide, native oxide, and chemical oxide. The solid lines refer to the left axis, and the dotted lines refer to the right axis. The error bars indicate the 1 standard deviation etch non-uniformities.

FIG. 2 displays the amount of oxide removed after a 10-second etch process. In this example, the amount of BPSG and PSG removed showed a slightly decreasing trend with increasing wafer temperature up to 50° C., while the amount of thermal oxide etched dropped by more than two orders of magnitude when the temperature was raised from the room temperature to 40° C. Above 40° C., the etching of thermal oxide essentially ceased. Since the BPSG films received a final high temperature anneal, it may be the doping, rather than the temperature of the last thermal cycle, that determined the relative temperature insensitivity of the vapor phase etching of the doped oxide films.

In this example, both native and chemical oxides also showed decreasing trends (dotted lines in FIG. 2) with increasing temperature, thus suggesting an increasing trend for the etch selectivities of doped oxides to native/chemical oxides.

Figure 3:
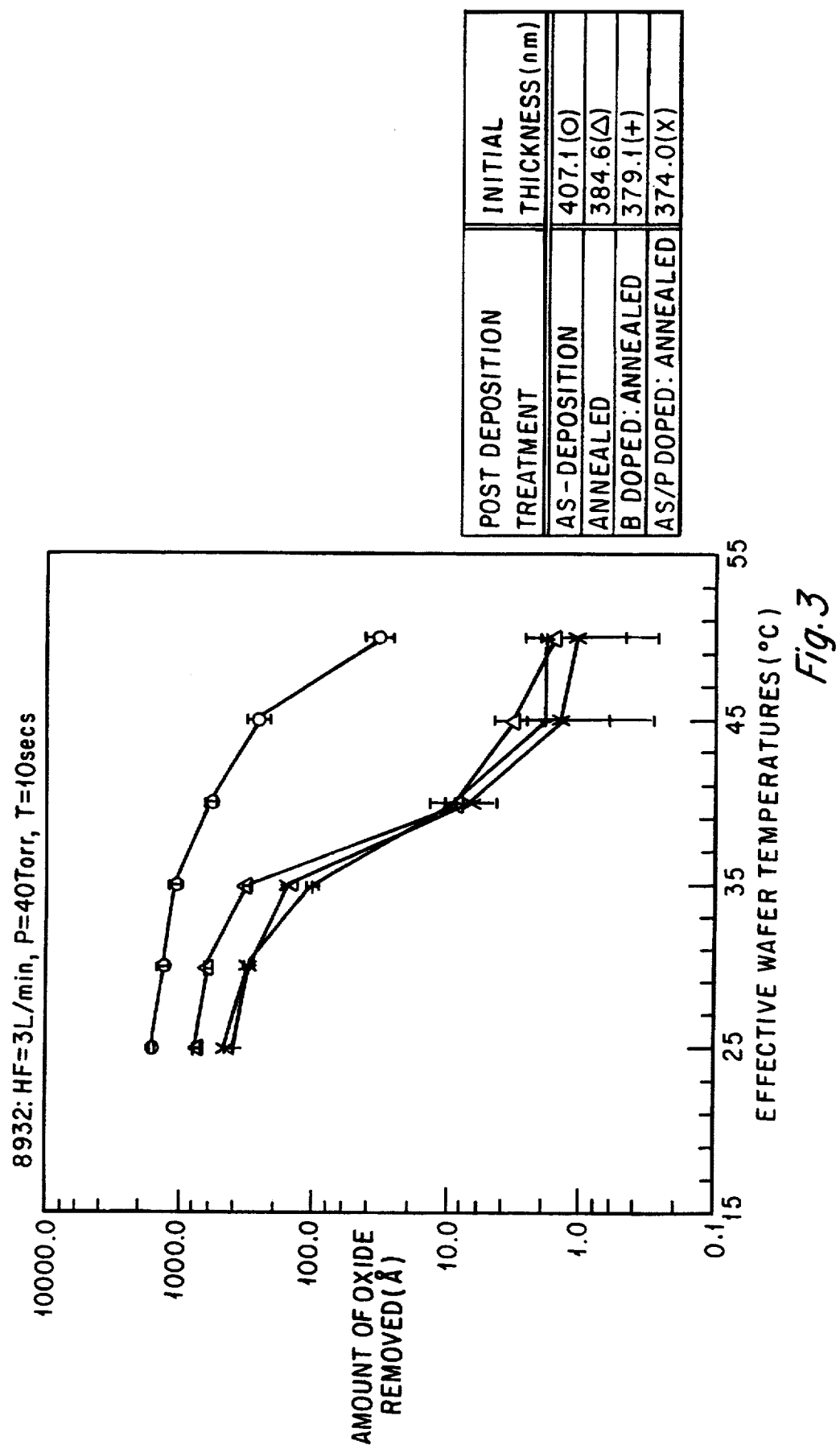

The results of another experiment are graphically illustrated in FIG. 3 which shows wafer temperature dependence of the vapor HF etch of as-deposited, annealed, B (boron) implanted and annealed, and As/P (arsenic/phosphorus) implanted and annealed LPCVD (low pressure chemical vapor deposited) non-plasma oxides. The error bars indicate the one standard deviation etch non-uniformities.

FIG. 3 displays the amount of non-plasma LPCVD oxide removed as a function of the wafer temperature. The densified oxide, whether doped or undoped, showed higher sensitivity to the temperature than the as-deposited oxide, with the etch essentially ceased above 45° C. SUPREM-III simulations showed that the number of dopant atoms per unit volume near the surface in the implanted oxides was below 1% for boron and significantly less than that for the As/P double implantation. Thus in the case of undoped or "lightly" doped LPCVD oxides, and unlike the highly doped BPSG and PSG, the temperature of the final thermal process has a significant effect on the temperature dependence of the vapor etch.

Interestingly, compared with the unimplanted oxide, both implanted oxides showed slightly reduced amounts of etch at low temperatures after the anneal, perhaps resulting from a higher degree of densification after the implantation, as indicated by the initial thickness measurements displayed in the table in FIG. 3.

Figure 4:
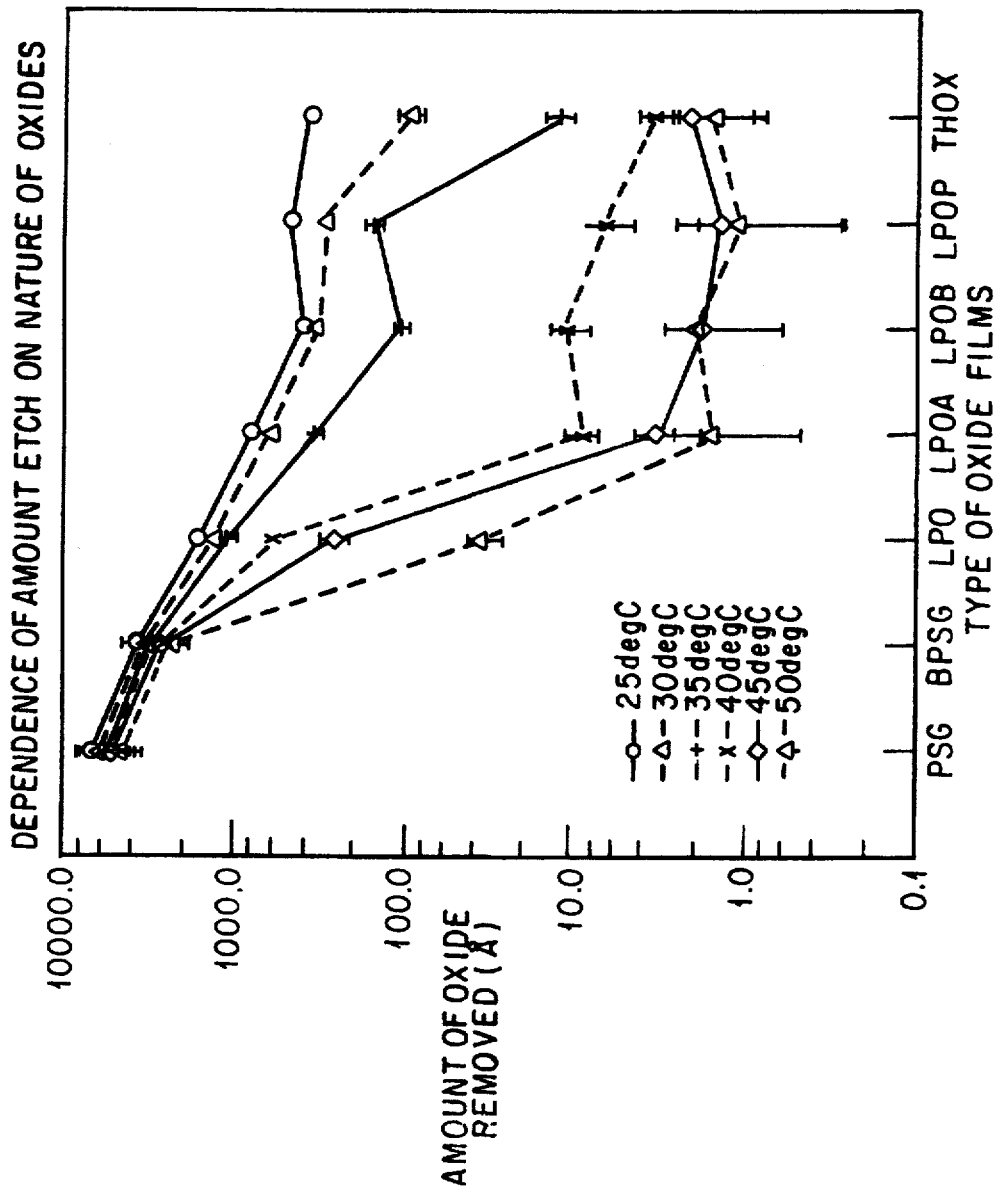
FIG. 4 illustrates the amount of oxide removed for various oxide types at different wafer temperatures.

To better emphasize the different temperature dependence of the various oxides, the data of FIGS. 2 and 3 are re-organized and plotted in FIG. 4. FIG. 4 illustrates comparison of the amount of various oxides removed at different temperatures. The following abbreviations are used: THOX: thermal oxide; LPO: as-deposited LPCVD oxide; LPOA: annealed LPCVD oxide; LPOB: B implanted and annealed; and LPOP:

As/P implanted and annealed. The error bars indicate the one standard deviation etch non-uniformities. It can be seen that the PSG and the thermal oxide occupy the low and the high ends of the sensitivity spectrum, respectively.

A third experiment is illustrated in the wafer diagrams of FIG. 5 which shows contour maps of (A) amount of PSG removed at the end of a 10-second etch, (B) amount of PSG removed at the end of a 25-second etch, and (C) amount of thermal oxide remaining at the end of a 25-second etch. The average thicknesses are 634 nm, 1067 nm, and 191 nm, and the contour spacings are 20 nm, 5 nm, and 5 nm, respectively.

Figure 5B:
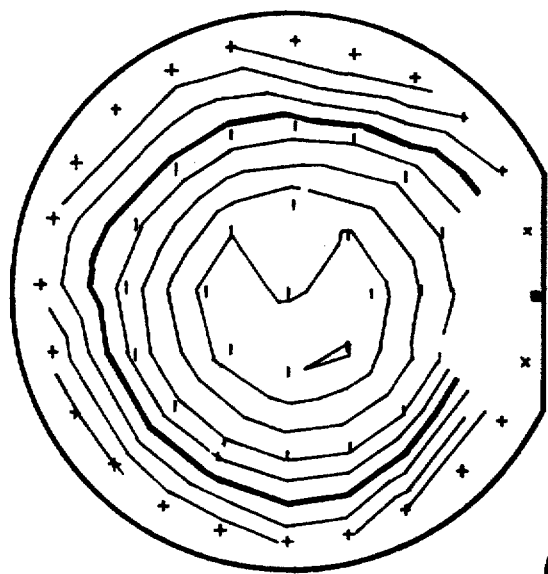
FIGS. 5A-5C illustrate a top view of a semiconductor wafer during various stages of an experimental selective oxide etch.
Figure 5C:
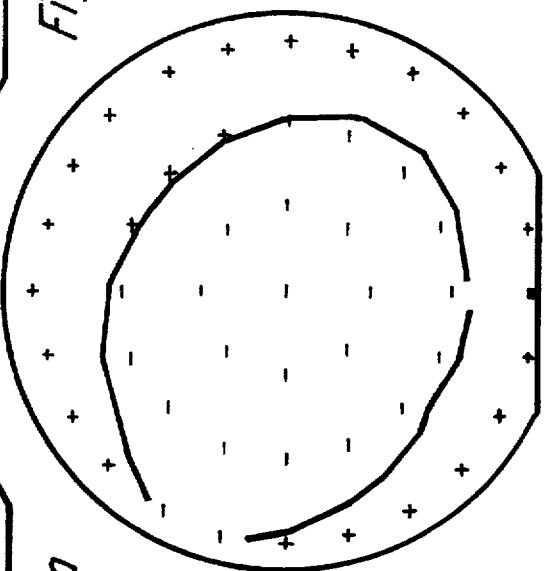
Figure 5A:
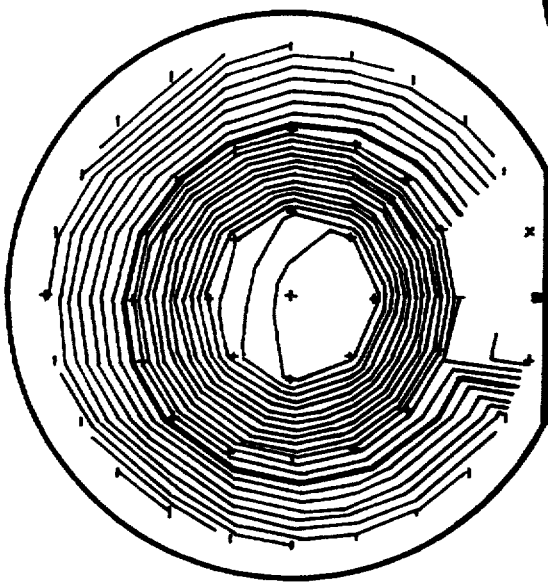

FIG. 5 illustrates how a PSG/thermal oxide double layer would behave when subjected to the vapor phase HF etch at a wafer temperature of around 45° C. The nominal thicknesses for the PSG and the thermal oxide films are 1 μm and 0.2 μm, respectively. After a 10-second etch (FIG. 5A), the PSG film was only partially etched and a one standard deviation non-uniformity of 25% was measured. At the end of a 25-second etch, the PSG film was completely removed, leaving only the bottom thermal oxide film. The corresponding non-uniformity was less than 1.5%, as shown in FIG. 5B. This improvement in the etch uniformity is explained by the very high etch selectivity between the PSG and the thermal oxide films at the elevated temperature. The thickness map of the remaining thermal oxide is displayed in FIG. 5C. Measurement indicated that the average amount of thermal oxide removed at the end of the 25-second etch was less that 10 nm.

Even though the BPSG films had slightly higher total doping concentrations than the PSG films, FIG. 2 shows that the amount of the BPSG film etched was only about 55% that of the PSG film etched, regardless of the wafer temperature during the vapor phase etch. The BPSG films, besides having boron and reduced phosphorus contents, also received an additional heat treatment after the deposition. An experiment involving a different set of BPSG films with fixed phosphorus concentration (2.5% by weight) was carried out and the data plotted in FIG. 6.

Figure 6:
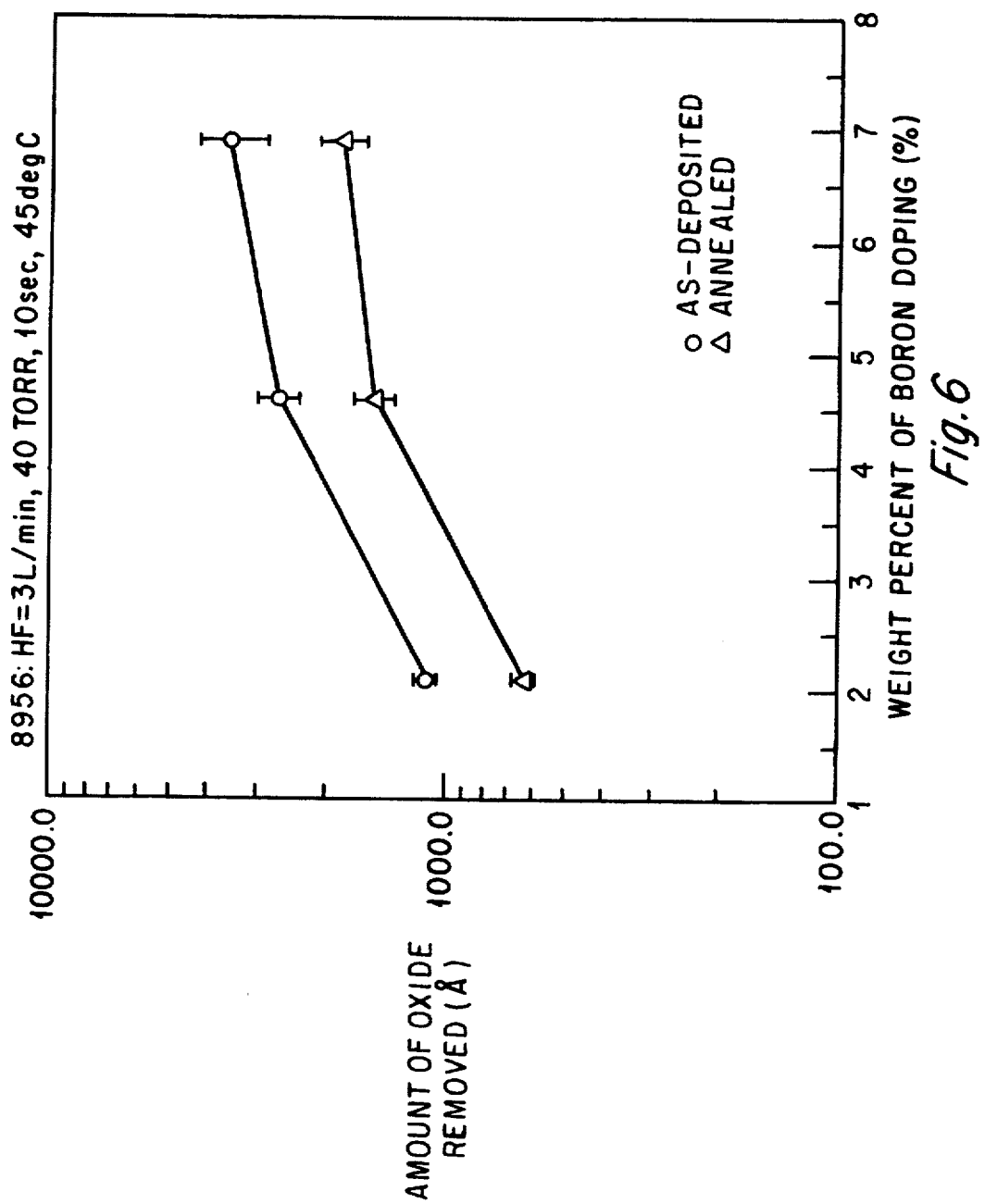
FIG. 6 is a graphical comparison of oxide etch rates for as-deposited and annealed oxides as a function of doping.

FIG. 6 illustrates the etch dependence on the boron concentration in the BPSG film. The etch was performed at 45° C. The annealing was done at 850° C. in nitrogen. The error bars indicate the one standard deviation non-uniformities. It can be seen that higher boron content was accompanied by more etch, and that the amount of the annealed film etched was also about 55% that of the amount of the as-deposited film etched. Therefore, it is likely that it is the difference in the post-deposition treatment, rather than the difference in the doping, that may explain the difference between the etching behavior of the BPSG and the PSG films shown in FIG. 2.

It has been shown that an incubation period, that is, a period during which there is no etching action, precedes the initiation of the vapor phase oxide etch. Therefore, the temperature dependence of the amount of oxide etched can be discussed in terms of the temperature sensitivities of the incubation time and the etch rate. Using an estimated average over-etch time of about 5 seconds for the PSG film, a thermal oxide etch rate of no more than 2 nm/s can be estimated from the PSG/thermal oxide double layer experiments, at a wafer temperature of about 45° C. On the other hand, it is shown in FIG. 2 that without the condensed liquid layer induced by the top PSG film, only about 2 Å of thermal oxide was removed after 10 seconds of etch. Therefore, higher wafer temperatures must have been accompanied by increases in the incubation times. This point of view should be applicable to the behavior of the non-plasma LPCVD oxides.

In conclusion, it was found that when HF/water vapor derived from an azeotropic solution of HF/water was used to etch various oxides of silicon, the etch rates had different sensitivities to the wafer temperature. The sensitivities apparently were affected by both the doping concentrations in the oxides and the final high temperature treatments received by the oxides. In one particular case, by increasing the wafer temperature from around 25° C. to around 50° C., the PSG to thermal oxide etch selectivity was increased from about 18:1 to at least 2900:1.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| Film Type | Method of Formation |
|---|---|
| Thermal Oxide | high temperature dry or steam oxide, grown between 850° and 950° C. |
| PSG | plasma TEOS oxide deposited between 350° C. and 450° C.; doped with approximately 8% P by weight; |
| BPSG | plasma TEOS oxide deposited between 350° C. and 450° C.; doped with approx. 4.5% B and 5.5% P by weight; subsequently densified at 850° C. in nitrogen |
| TEOS | non-plasma undoped TEOS oxide deposited at 700° C. |
| Annealed TEOS | non-plasma undoped TEOS oxide deposited at 700° C.; subsequently densified at 900° C. in nitrogen |
| B Implanted TEOS | non-plasma undoped TEOS oxide deposited at 700° C.; implanted with boron; subsequently densified at 900° C. in nitrogen |
| As/P Implanted TEOS | non-plasma undoped TEOS oxide deposited at 700° C.; implanted with arsenic and phosphorus; subsequently densified at 900° C. in nitrogen |
| Native Oxide | oxide on "virgin" wafer from sealed wafer box |
| Chemical Oxide | oxide grown after $NH_4OH/H_2O_2/H_2O$ clean |

What is claimed is:

1. A method of selectively etching oxides from the face of a semiconductor wafer comprising the steps of:
   providing a semiconductor wafer, said wafer having a first doped oxide region, and a second doped oxide region wherein said first doped oxide region has a dopant concentration greater than said second doped oxide region formed on the surface thereof;
   heating the wafer to a temperature greater than room temperature; and
   performing a vapor phase hydrogen fluoride etch such that said heavily doped oxide etches away at a rate higher than said lightly doped oxide region.

2. The method of claim 1 wherein said wafer is heated to between 35° C. and 50° C.

3. The method of claim 1 wherein said wafer is heated to less than 250° C.

4. The method of claim 1 wherein said first doped oxide region comprises a phosphosilicate glass region.

5. The method of claim 1 wherein said first doped oxide region comprises a borophosphosilicate glass region.

6. The method of claim 1 and further comprising the step of reducing the pressure to between 10 and 700 torr.

7. The method of claim 1, wherein said second doped oxide region comprises TEOS oxide.

8. The method of claim 1, wherein said second doped oxide region is a deposited oxide doped with boron.

9. The method of claim 1, wherein said second doped oxide region is a deposited oxide doped with arsenic and phosphorus.

10. The method of claim 1, wherein said heavily doped oxide region is located over said second doped oxide region.

11. The method of claim 1, wherein said heavily doped oxide region is located at the surface of the semiconductor wafer and said second doped oxide region is located at the surface of the semiconductor wafer.

12. A method of selectively etching oxides from the face of a semiconductor wafer comprising the steps of:

providing a semiconductor wafer, said wafer having a first oxide region and an annealed second oxide region formed on the surface thereof;

heating the wafer to a temperature greater than room temperature; and performing a vapor phase hydrogen fluoride etch such that said first oxide region etches away faster than said annealed second oxide region.

13. The method of claim 12, wherein said first oxide region comprises a silicate glass.

14. The method of claim 12, wherein said first oxide region comprises a TEOS oxide and said annealed second oxide region comprises an annealed TEOS oxide.

15. The method of claim 12, wherein said annealed second oxide region is doped with boron.

16. The method of claim 12, wherein said annealed second oxide region is doped with arsenic and phosphorus.

17. The method of claim 12, wherein said wafer is heated to between 35° C. and 50° C.

18. The method of claim 12, wherein said wafer is heated to less than 250° C.

19. The method of claim 12 and further comprising the step of reducing the pressure to between 10 and 700 torr.

20. The method of claim 12 and further comprising the step of reducing the pressure to between 35 and 45 torr.

* * * * *

UNITED STATES PATENT AND TRADEMARK OFFICE
CERTIFICATE OF CORRECTION

PATENT NO. : 5,376,233
DATED : December 27, 1994
INVENTOR(S) : Man Wong

It is certified that error appears in the above-indentified patent and that said Letters Patent is hereby corrected as shown below:

On the title page item [75], "Yong" should read --Wong--.

Signed and Sealed this

Fourteenth Day of March, 1995

Attest:

BRUCE LEHMAN

Attesting Officer

Commissioner of Patents and Trademarks